United States Patent [19]

Shibata et al.

[11] Patent Number: 5,521,858
[45] Date of Patent: May 28, 1996

[54] SEMICONDUCTOR DEVICE

[76] Inventors: Tadashi Shibata, 2-5, Nihondaira, Taihaku-ku; Tadahiro Ohmi, 1-17-301, Komegabukuro 2-chome, Aoba-ku, both of Sendai-shi, Miyagi-ken 980, Japan

[21] Appl. No.: 374,779

[22] Filed: Feb. 28, 1995

[30] Foreign Application Priority Data

Jul. 29, 1992 [JP] Japan .................................. 4-222166

[51] Int. Cl.$^6$ ................................................. H03K 19/20
[52] U.S. Cl. .................................. 365/185.03; 365/185.1; 365/185.14; 365/185.08; 365/49; 326/35
[58] Field of Search ............................. 365/45, 185, 184, 365/49; 326/35, 44; 395/21, 24; 327/63

[56] References Cited

U.S. PATENT DOCUMENTS

| 5,247,206 | 9/1993 | Castro ........................................ 395/23 |
|---|---|---|
| 5,258,657 | 11/1993 | Shibata et al. ............................ 326/35 |
| 5,331,215 | 7/1994 | Allen et al. ................................ 395/24 |
| 5,336,936 | 8/1994 | Allen et al. ............................... 365/185 |
| 5,336,937 | 8/1994 | Sridhar et al. ............................ 326/35 |

FOREIGN PATENT DOCUMENTS

| 2-74053 | 3/1990 | Japan . |
|---|---|---|
| 2-224190 | 9/1990 | Japan . |
| 2-281759 | 11/1990 | Japan . |
| 3-6679 | 1/1991 | Japan . |
| 3-63996 | 3/1991 | Japan . |

Primary Examiner—David C. Nelms
Assistant Examiner—Vu A. Le
Attorney, Agent, or Firm—Baker & Daniels

[57] ABSTRACT

A semiconductor device of simple circuit capable of comparing the magnitudes of plural data at a high speed. This device has an inverter circuits formed by neuron MOS transistors; means for applying to a first input gate of the inverter circuit a first signal voltage which is common to the inverters belong to the foregoing inverter circuit group; means for applying predetermined second signal voltage to one or more second inout gates other than the first input gate of the inverter; and means for detecting the variation of the output voltage in at least one inverter circuit of the inverter circuit group due to the variation with time of either the first or the second signal voltage or both, and for applying positive feedback to given inverters of the inverter circuit group according to the detection.

8 Claims, 14 Drawing Sheets

OUTPUT OF INVERTER 108

BINARY COUNTER

SEMICONDUCTOR DEVICE

TECHNICAL FIELD

The present invention relates to a semiconductor device, and in particular, provides a high performance semiconductor integrated circuit which is capable of comparing the magnitudes of a plurality of inputted data at a high speed using hardware.

BACKGROUND ART

In the fields of data processing or automatic control, the comparison of data expressed as numerical values and the classification of the magnitudes thereof is extremely important.

These include, for example, the determination of the larger of two numbers, the selection, from a plurality of input data, of data having the maximum value, or the arrangement by size and numerical value of a plurality of data, that is to say, sorting, etc.

Such separations can be conducted using a standard calculator; however, in order to conduct a large number of calculations, a large period of time is required, and this is thus very difficult to use in real-time control. In particular, in the case of use in the control of robots or the like, installation in the robots is required, so that realization in terms of a small LSI chip has been desired.

Using a microprocessor, when the programming thereof was attempted, an enormous amount of time was required, so that the application thereof was essentially impossible. Research and development has been conducted in order to produce a circuit which conducts direct magnitude comparison by means of hardware; however, a great number of elements are required for the realization of such a circuit and because calculations are carried out via a number of stages of circuits, large-scale integration which is small in size and is capable of high speed calculation has not yet been realized.

The present invention has as an object thereof to provide a semiconductor device which is capable of carrying out calculations for comparing the magnitude of a plurality of data at high speed using simple circuitry.

DISCLOSURE OF THE INVENTION

The semiconductor device in accordance with the present invention has a structure employing one or more neuron MOS transistors, which possess a semiconductor region having a certain conductivity on a substrate, possess a source region and a drain region of opposite conductivity which are provided within this region, have a floating gate electrode which is provided via an insulating film in a region separate from the source region and the drain region and is in a potentially floating state, and possesses a plurality of input gate electrodes which are capacitively coupled with the floating gate electrode via an insulating film, characterized in having an inverter circuit group containing one or more inverter circuits formed by neuronal MOS transistors; a means for applying to a first input gate of the inverter circuit a first signal voltage which is common to one or more inverters belonging to the inverter circuit group; a means for applying a predetermined second signal voltage to one or more second input gates other than the first input gate of the inverter circuit; and a means for detecting the variation of the output voltage produced in at least one inverter circuit of the inverter circuit group due to the variation over time of either the first or second signal voltage or both, and for applying positive feedback to predetermined inverters of the inverter circuit group in accordance with this.

BRIEF DESCRIPTION OF THE DRAWINGS

FIG. 1($b$) is a modified example using a CMOS switch; and FIG. 1($c$) is a modified example using a three-bit digital signal in place of the analog signal $V_b$.

FIG. 2($b$) is a simplified diagram thereof for the purpose of the analysis of the vMOS operation.

FIG. 3($b$) is a graph showing the input signal as it rises in a straight-line manner from 0 V to 5 V ($V_{DD}$) over time; FIG. 3($c$) is a circuit diagram showing a modified example of the second example; FIG. 3($d$) is an output waveform diagram obtained by means thereof; FIG. 3($e$) is a circuit diagram showing another modified example of the second example; FIG. 3($f$) shows the output signal as $V_R$; and FIG. 3($g$) shows another modified example.

FIG. 4($b$) shows the experimental results thereof.

FIG. 6($b$) is a circuit diagram showing a fifth example of the present invention.

DESCRIPTION OF THE REFERENCES

Figure 1A:
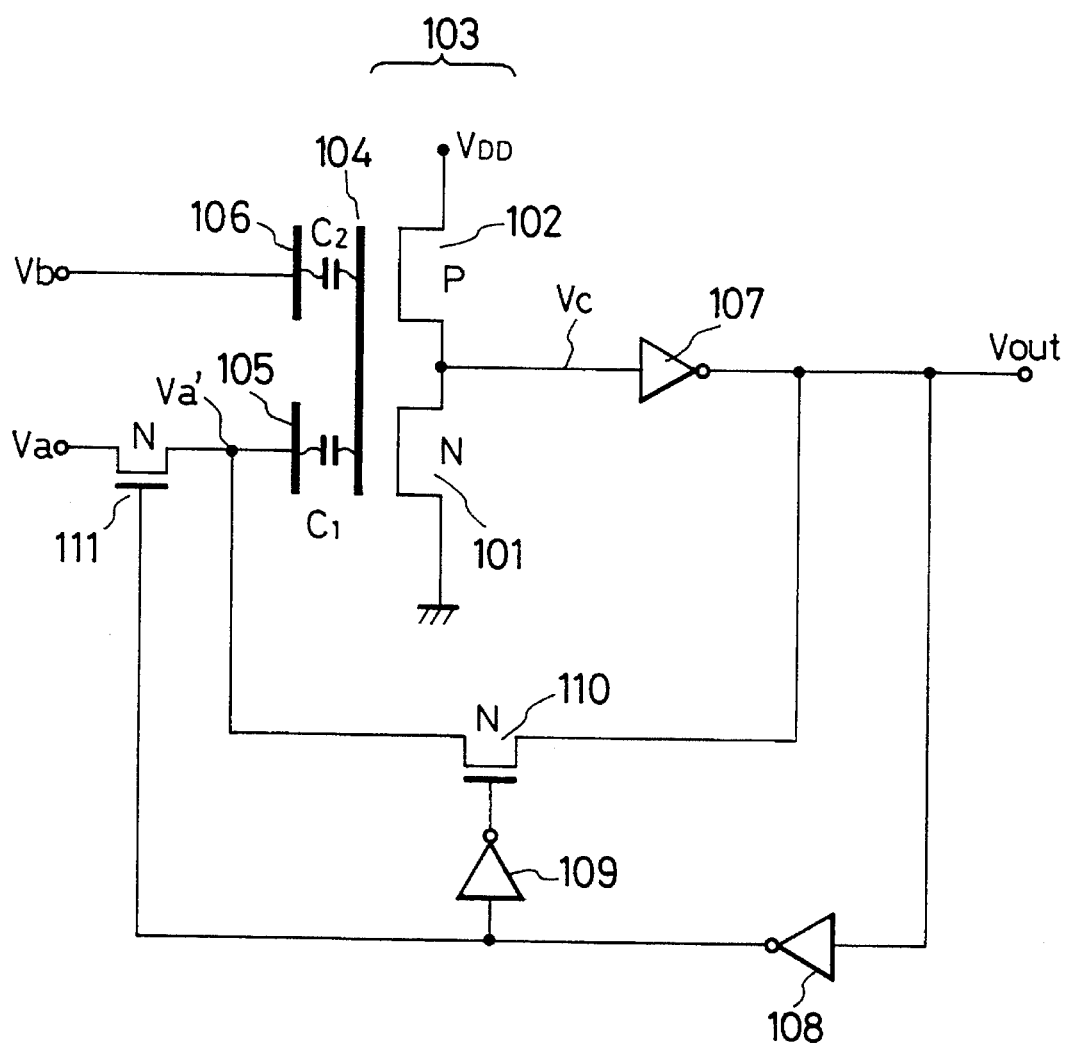
FIG. 1($a$) is a circuit diagram showing a first example of the present invention.

101 N-channel neuron MOS transistor
102 P-channel neuron MOS transistor
104 Floating gate
105, 106 Input gates
107, 108, 109 Common inverter circuits
110, 111 NMOS transistors

BEST MODE FOR CARRYING OUT THE INVENTION

Hereinbelow, the present invention will be explained in detail using examples; however, it is of course the case that the present invention is in no way limited to the embodiments described.

EMBODIMENT 1

A first embodiment of the present invention will be explained using the circuit diagram of FIG. 1($a$).

In the Figure, reference numerals 101 and 102 indicate, respectively, a N-channel neuron MOS transistor and a P-channel neuron MOS transistor. The neuron MOS transistor is a transistor which functions in the same manner as the neurons comprising the nerve cells forming the brain; these are MOS-type transistors which are based on a completely novel concept invented in order to realize a neuron computer (inventors: Tadashi SHIBATA, Tadahiro (OHMI, Japanese Patent Application, First Publication, Laid-Open No. Hei 3-6679). Hereinbelow, such transistors will be abbreviated as "νMOS".

These νMOS are transistors having extremely high performance, and the present invention is strongly characterized by the use of such νMOS as fundamental elements thereof. The structure and function of the νMOS will be explained using the separately attached FIG. 2.

The N-channel νMOS (abbreviated as "N-νMOS") and the P-channel νMOS (abbreviated to "P-νMOS") have drains which are mutually connected and form an inverter circuit having a CMOS structure using neuron MOS. This is termed a "complementary νMOS inverter", or is referred to in a abbreviated form as a "C-νMOS inverter". Reference numeral 104 indicates a floating gate; this is a gate common to 2 νMOS (101, 102). Reference numerals 105 and 106 indicate input gates, and $C_1$ and $C_2$ represent capacitive coupling coefficients between these input gates and the floating gate.

Reference numerals 107, 108, and 109 indicate normal inverter circuits, and reference numerals 110 and 111 are NMOS transistors which function as switches.

Two signal voltages $V_a$ and $V_b$ are inputted into this circuit; $V_a$ is, for example, a reference voltage determining the circuit operation, while $V_b$ is a signal voltage which is varied in a freely selected manner over time. In this circuit, when the value of $V_b$ exceeds the peak value which is indicated by means of $V_a$ in advance, $V_{out}$ is set to $V_{DD}$, that is to say, "1".

That is to say, if $V_a$ is, for example, a signal expressing a temperature, then when the temperature exceeds a stipulated value, the value of $V_{out}$ becomes 1, and this could be applied to an alarm system or the like.

Figure 2A:
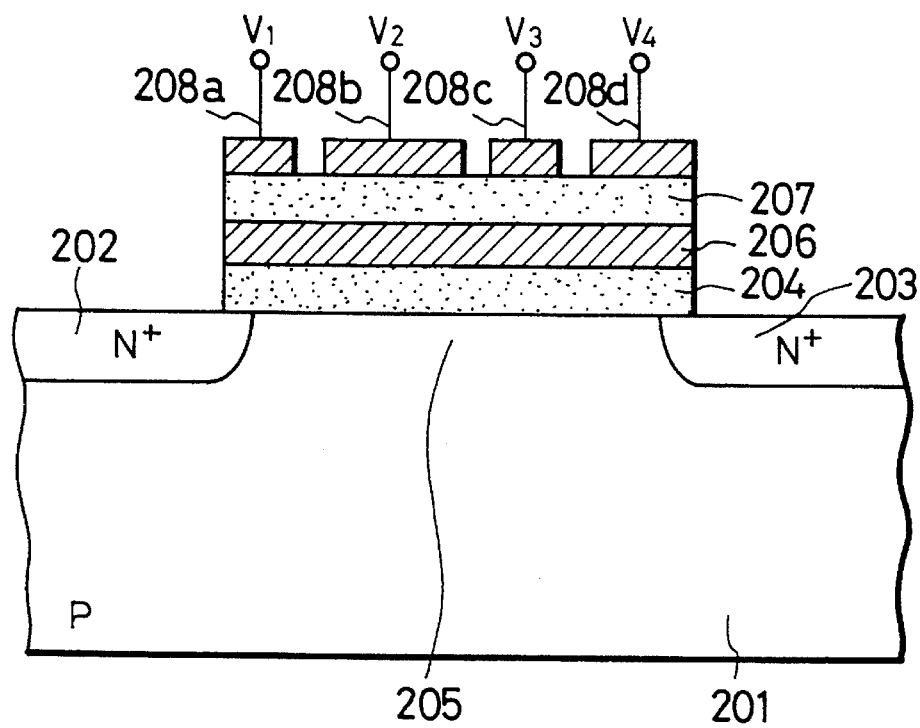
FIG. 2($a$) shows the cross sectional structure of an example of an input N channel vMOS transistor (N-vMOS)
Figure 2B:
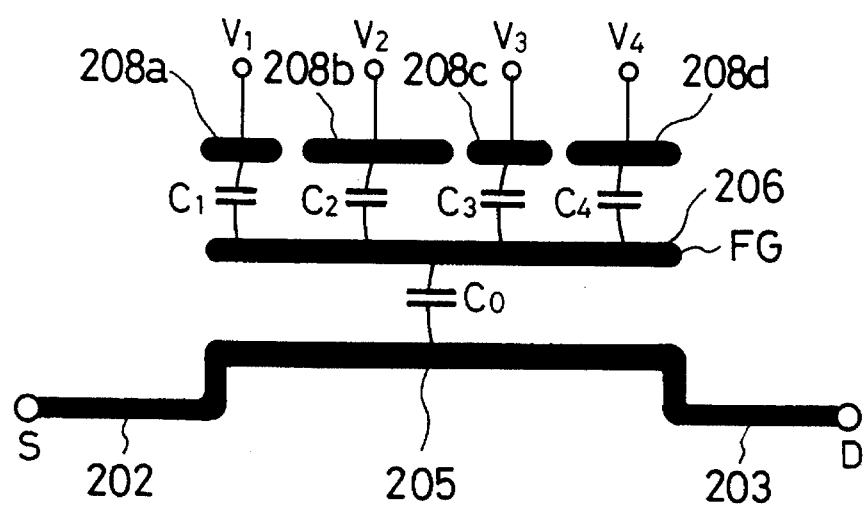

In order to explain the operation of the circuit in FIG. 1(a), first, the structure and operating principle of the νMOS should be explained. FIG. 2(a) shows an example of the cross sectional structure of a 4-input N-channel νMOS transistor (N-νMOS); reference numeral 201 indicates, for example, a P-type silicon substrate, reference numerals 202 and 203 indicate a source and a drain formed by N$^+$ diffused layers, reference numeral 204 indicates a gate insulating film (for example, a SiO$_2$ film) which is provided above the channel region 205 between the source and the drain, reference numeral. 206 indicates a floating gate electrode which is electrically insulated and which is in a potentially floating state, reference numeral 207 indicates, for example, an insulating film of SiO$_2$ or the like, and reference numerals 208a, 208b, 208c, and 208d indicate input gate electrodes. FIG. 2(b) shows a simplification of this structure for the purpose of the analysis of the νMOS operation. If the capacitive coupling coefficients between each input gate electrode and the floating gate are represented as shown in the diagram by $C_1$, $C_2$, $C_3$, and $C_4$, and the capacitive coupling coefficient between the floating gate and the silicon substrate is represented by $C_0$, then the potential $\Phi_F$ the floating gate is given by the following formula.

$$\Phi_F = (1/C_{TOT})(C_1V_1 + C_2V_2 + C_3V_3 + C_4V_4)$$

Here, $$C_{TOT} = C_O + C_1 + C_2 + C_3 + C_4$$

$V_1$, $V_2$, $V_3$, and $V_4$ indicate voltages applied, respectively, to input gates 208a, 208b, 208c, and 208d, and the potential of the silicon substrate is 0 V, so that it is grounded.

The potential of source 202 is set to 0 V. That is to say, potentials of all the electrodes are set to the values measured as a source standard. By doing this, the νMOS shown in FIG. 2 is identical to a common N-channel MOS transistor if the floating gate 206 is seen as a normal gate electrode; when the gate potential $\Phi_F$ becomes greater than a threshold value ($V_{TH*}$), then an electron channel (a N-channel) is formed in the region 205 between the source 202 and the drain 203, and the source and the drain are electrically connected. That is to say, when the following condition is satisfied, $$(1/C_{TOT})(C_1V_1 + C_2V_2 + C_3V_3 + C_4V_4) > V_{TH*}$$

the νMOS becomes conductive (ON).

The foregoing explanation referred to an N-channel νMOS transistor; however, devices also exist in which the source 202, drain 203, and substrate 201 in FIG. 2(a) are all made opposite conductivity-types. That is to say, the νMOS is such that the substrate is of the N-type, and the source and drain are formed from P$^+$-diffused layers, and this is termed a "P-channel MOS transistor" (P-νMOS).

Next, the operation of the C-νMOS inverter 103 shown in FIG. 1(a) will be explained.

If the potential of the floating gate 104 is represented by $\Phi_F$, then $$\Phi_F = \frac{C_1V_a + C_2V_b}{C_{TOT}} \qquad (1)$$

and when $\Phi_F$ exceeds the inversion voltage $V_1^*$ of the inverter as viewed from the floating gate, that is to say, when the following condition is satisfied:

$$\Phi_F = \frac{C_1V_a + C_2V_b}{C_{TOT}} > V_1^* \qquad (2)$$

then the inverter 103 enters an ON-state, and the output thereof is inverted (however, it is assumed that transistor 111 is in an ON-state, and that Va=Va'). Here, in order to simplify the explanation, it will be assumed that the condition $C_0 \ll C_1+C_2$ holds, and that $C_0$ can be ignored. That is to say, $C_{TOT}=C_1+C_2$ is assumed. It is of course the case that the following explanation would be unchanged even if $C_0$ were to have a value approximately equal to that of $C_1+C_2$. In the circuit in FIG. 1(a), setting is conducted so that, for example, $C_1=C_2$.

The value of $V_1$ is set so as to be, for example, $V_{DD}/2$, so that if $V_{DD}$ is set to 5 V, then this is 2.5 V. It is of course the case that these values may also be set to other values where necessary.

Under the above conditions, the conditions under which the C-νMOS inverter 103 is in an ON-state is, from Formula (2), $$V_a + V_b \geq 5[V] \qquad (3).$$

Now, for example, it will be assumed that $V_a=2$ V is inputted, and $V_b$ had a value of 0 V. Since Formula (3) does not hold true, the inverter 103 is in an OFF-state, and the output voltage $V_c$ has a value of 5 V.

Accordingly, $V_{OUT}=0$ V, the gate voltage of NMOS 110 is 0 V, and the switch is in an OFF-state, and the gate voltage of NMOS 111 is 5 V, so that the switch is in an ON-state.

When the value of $V_b$ varies over time, when $V_b \geq 3$ V, Formula (3) becomes true, and the inverter 103 is placed in an ON-state and $V_c$ begins to change in value from 5 V to 0 V.

This change is amplified by inverter 107 and $V_{OUT}$ rapidly changes from a value of 0 to 1 (5 V).

By means of this, the gate voltage of transistor 110 becomes 5 V, and the transistor is placed in an ON-state and becomes conductive. That is to say, with respect to inverter 103, an output $V_{OUT}$ is fed back to input gate 105. This is of course a positive feedback, and the circuit stores $V_{OUT}=1$. That is to say, when the vMOS inverter 103 enters an ON-state, a positive feedback loop is automatically closed, and using vMOS inverters, a so-called "flip-flop" circuit is achieved.

As is clear from the foregoing explanation, the circuit of the first embodiment of the present invention shown in FIG. 1(a) fixes the output $V_{OUT}$ at a value of 1 only when $V_b$ exceeds a set value (3 V).

By means of such a simple structure, a circuit can be realized which emits an alarm when a peak value is detected. Furthermore, $V_{OUT}$ may be used in the switch control of a lamp or buzzer. The alarm may be reset by setting $V_b=0$.

The foregoing represented the simplest application, in which only one vMOS inverter 103 was used; however, by means of using a plurality of vMOS inverters, higher level applications are possible. These will be explained in the second and subsequent embodiments.

$V_a$ was made a reference signal voltage having a constant value, and $V_b$ was made the monitor signal input; however, the operation will be identical if these are reversed. That is to say, $V_b$ may be made a constant reference signal, and $V_a$ may be made a monitor signal. Furthermore, it is of course the case that both $V_a$ and $V_b$ may be made signal inputs which vary over time. Furthermore, NMOS transistors were used for switches 110 and 111; however, the maximum value of the output voltage of these switches, for example, $V_a'$, is $V_{DD}-V_{TH}$ ($V_{TH}$ is the threshold voltage of the NMOS 111), and when $V_a$ is in excess of this value, the input signal into the first input gate 105 has the constant value $V_{DD}-V_{TH}$.

Figure 1B:
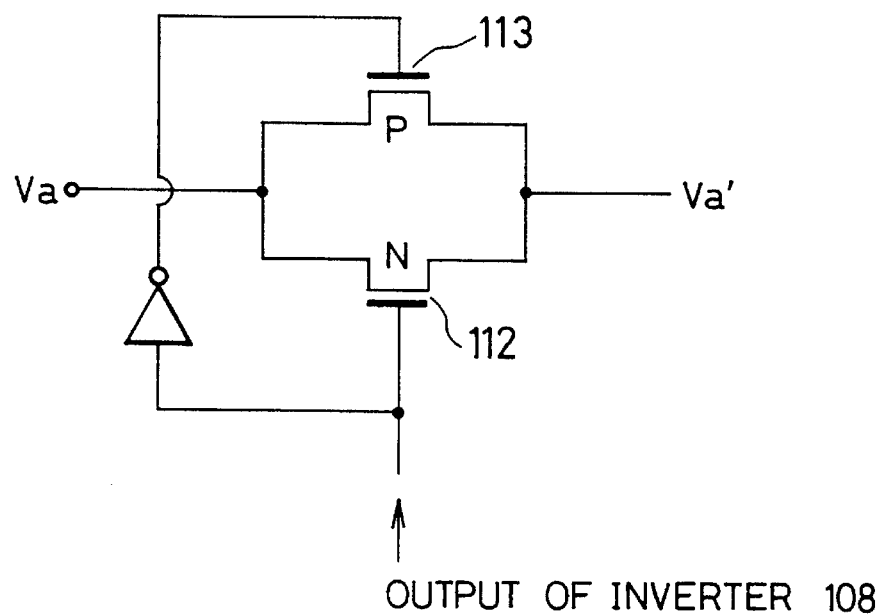

A CMOS switch such as that shown in FIG. 1(b), for example, may be used in placed of the transistor 111 in order to be sure of obtaining a value of $V_a$ which is equal to the value of $V_a'$, and at this time, insofar as the output of the inverter 108 is $V_{DD}$, one or the other of NMOS 112 and PMOS 113 will be in an ON-state, so that $V_a$ is always equal to $V_a'$.

With respect to switch 110, as well, it is of course the case that the use of the CMOS switch of FIG. 1(b) is preferable to the use of an NMOS.

If the switch transistors are NMOS, as in FIG. 1(a), and, for example, the bootstrap circuit method is introduced, the gate voltage may be set sufficiently high, and the cut-off of the transistor when the output voltage becomes large can be prevented. Furthermore, inverter 108 is not necessarily required. In such a case, $V_{OUT}$ may be directly connected to the gate electrode of NMOS 110, and the inverse signal may be inputted into the gate of NMOS 111. When, as in the circuitry of FIG. 1(a), an inverter 108 is inserted, and this inverter possesses a delay $\tau$ in time, the output of inverter 103 is subjected to feedback in a sufficiently stable state, so that the noise margin can be increased. Furthermore, transistor 111 may be omitted.

Figure 1C:
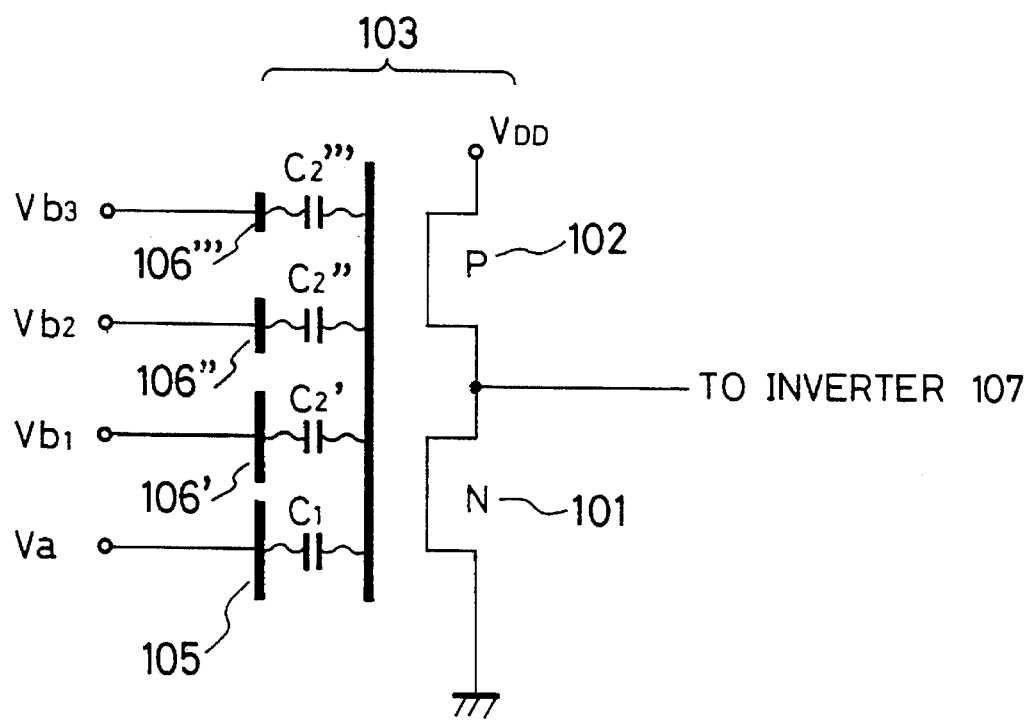

In this case, the current driving force of the transistor of inverter 107 may be set so as to be sufficiently larger than that of the transistor of the circuit outputting $V_a$. Alternatively, a resistor may be inserted in place of transistor 111, and the resistance value may be set so as to be sufficiently larger than the ON-resistance of the NMOS or PMOS of the inverter 107. Furthermore, in the circuitry in FIG. 1(a), discussion centered on the case in which an analog signal was used as the $V_b$ input; however, a digital signal or the like may be applied. FIG. 1(c) shows an embodiment in the case in which a three-bit digital signal, $V_{b1}$, $V_{b2}$, $V_{b3}$ ($V_{b3}$ is the least significant bit) is applied in place of the analog signal $V_b$; only the C-vMOS inverter 103 portion is depicted. All other parts are identical to those in FIG. 1(a). The $C_2$ of FIG. 1(a) is divided among capacitors $C_2'$, $C_2''$, $C_2'''$, and the bit signals are inputted thereinto, respectively. If the relationship $C_2':C_2'':C_2'''$ is set equal to 4:2:1, then the following formula corresponds to Formula (3):

$$V_a + 1/7(4V_{b1} + 2V_{b2} + V_{b3}) \geq 5 \qquad (4)$$

and the input signal is a D/A-converted value of the 3-bit binary signal.

EMBODIMENT 2

FIG, 3(a) is a circuit diagram showing a second embodiment of the present invention.; this is termed a "WINNER-TAKE-ALL" circuit. That is to say, in this circuit, output signal outputs $V_{01}, V_{02}, \ldots, V_{0n}$, correspond to a number n of input signals $V_1, V_2, \ldots, V_n$, and only the output corresponding to the maximum input has a value of "1", while the other outputs all have a value of "0". Only the "winner" has a value of "1", and survives, while the other outputs all have a value of "0", and it is for this reason that the circuit is termed a "WINNER-TAKE-ALL circuit". Such a circuit fulfills an extremely important function not only in neural networks, but in various type of image processing.

Figure 3A:
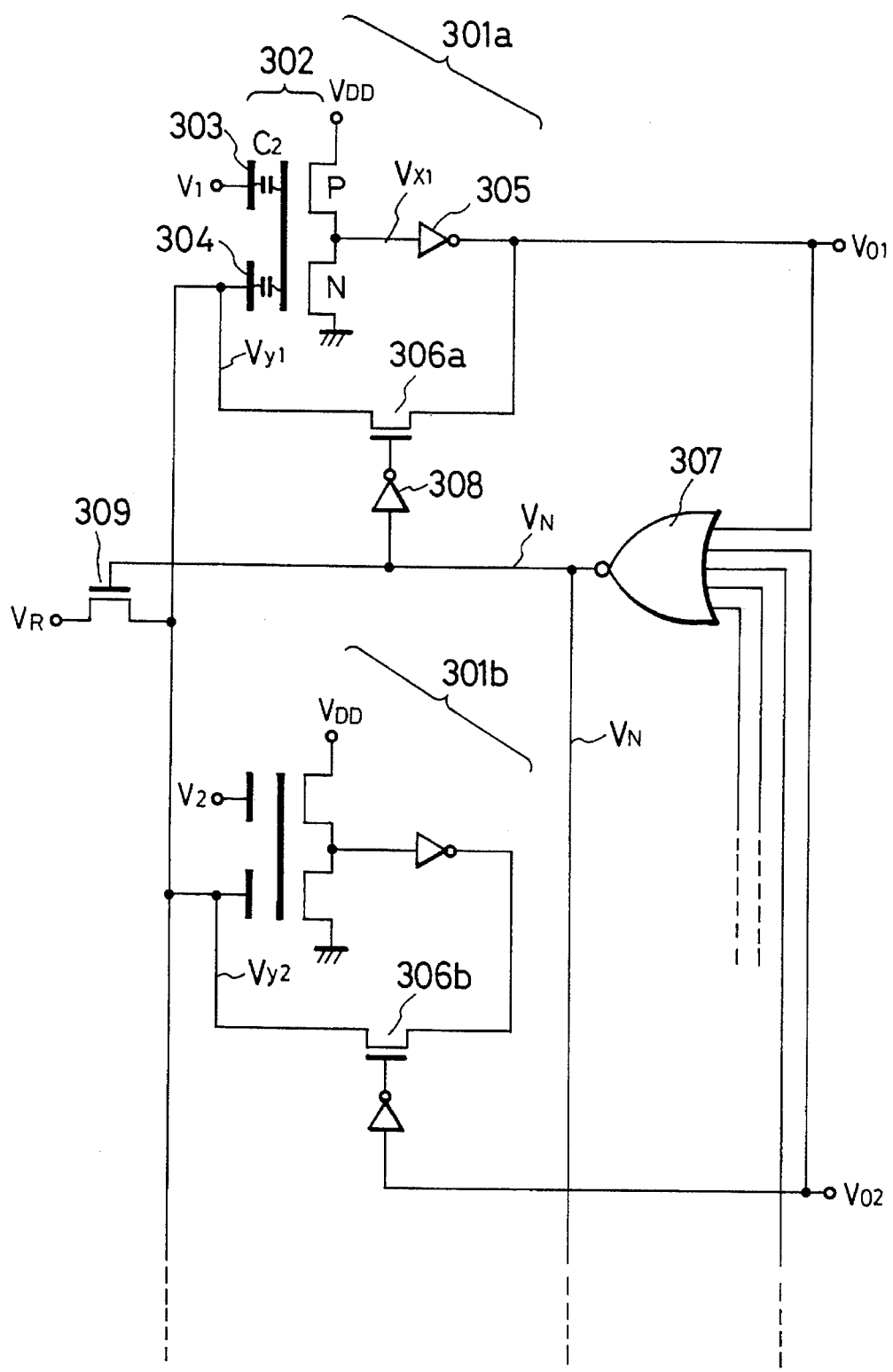
FIG. 3($a$) is a circuit diagram showing a second example of the present invention.

In the circuitry of FIG. 3(a), a plurality of circuit blocks 301a, 301b, . . . , identical to that of FIG. 1(a) are arranged; in the Figure, only two blocks are shown as representatives, but this may be expanded to a freely selected number where necessary. (It will be assumed that a number n are present.) In the block numbered 301, reference 302 indicates a C-vMOS inverter, and reference 303 indicates an input terminal into which a signal $V_1$ is inputted.

Reference numeral 304 indicates a control code input terminal; a signal $V_R$ common to the other blocks is inputted thereinto.

Reference numeral 305 indicates an inverter for inverting and amplifying the output voltage of the vMOS inverter 302, and reference numeral 306a indicates a switching transistor for opening and closing a positive feedback loop.

The point of difference with the circuitry of FIG. 1(a) lies in the use of a multi-input (an n-input) NOR circuit 307 in place of the inverter 108; the output signals of all the blocks, $V_{01}, V_{02}, \ldots, V_{0n}$, are inputted into this NOR circuit. The output $V_n$ of the NOR circuit is inverted by the inverter 308 which is installed in each block, and is inputted into the gate of a transistor 309 which serves to control the ON and OFF state of the transistor 306 and to cut the $V_R$ signal.

The operation of this circuit is basically identical to that of the operation of the circuit of FIG. 1(a), so that it can be readily understood.

If, as in FIG. 1(a), $C_1=C_2$ is assumed in vMOS inverter 302, and furthermore, the inversion voltage $V_I$ as seen from the floating gate is assumed to be equal to $V_{DD}/2$, equaling 5[V], and $C_1+C_2=C_{TOT}$ is assumed, then the conditions under which the vMOS inverter 302 enters an ON-state are, from Formula (3), $$V_1+V_R \geqq 5[V] \tag{5}$$

The conditions from Formula (5) are the same for all other blocks:

$$V_i+V_R \geqq 5[V] \; (i=1, 2, \ldots, n) \tag{6}$$

Figure 3B:
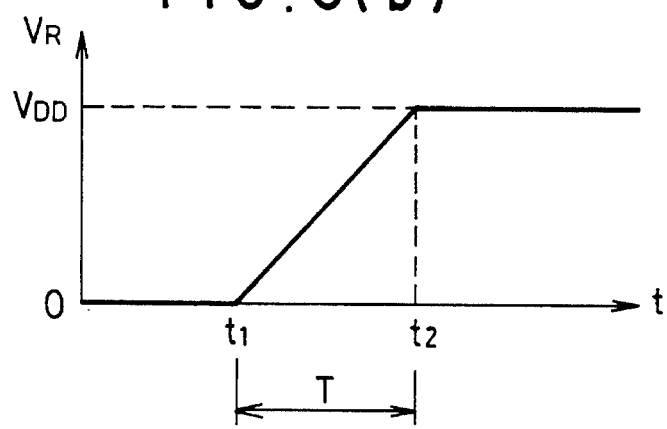

Next, as $V_R$, a signal input is used which, for example, as in FIG. 3(b), increases in a straight-line manner from 0 V to 5 V ($V_{DD}$) over time. $V_R$ is applied in common to all blocks, so that the conditions of Formula (6) are satisfied initially in the block into which the largest value of $V_i$ is inputted. Here, to facilitate the explanation, it will be assumed that $V_1$ has the largest value among $V_1, V_2, \ldots, V_n$, and that, for example, $V_1$=3.2 V. If this is true, when $V_R$=1.8 V, then the conditions of Formula (5) are fulfilled, and the vMOS inverter 302 enters an ON-state, and the output voltage $V_{x1}$ begins to decline from $V_{DD}$ (5 V) toward 0 V. This change is amplified by inverter 305, and the output $V_{01}$ of inverter 305 rapidly increase from 0 V to 5 V.

Reference numeral 307 indicates an NOR circuit having a number of inputs n, and in this circuit, if any of the inputs have a value of 1, the output falls to a value of 0. That is to say, when the output $V_{01}$ of the block 301a reaches a value of 1, this is detected, and $V_N$ is reduced to a value of 0. As a result, the NMOS 306a, 306b, . . . , are placed in an ON-state, and the feedback loops of all blocks are closed. At this time, in each block, the voltages outputted by the block ($V_{01}, V_{02}, \ldots, V_{0n}$) are stored in an unchanged manner in the flip-flops.

Accordingly, only the value of $V_{01}$ becomes "1", and other outputs ($V_{02}, V_{03}, \ldots, V_{0n}$) all have a value of "0". That is to say, only that cell having the largest inputs survives, and all others have a value of "0".

In this way, the maximum input can be detected extremely easily.

Conventionally, in the realization of such "Winner-Take-All" functions, it was common to employ a computer. That is to say, after converting all input signals from analog into digital, the maximum value was determined by conducting a comparison of all data.

In order to determine the maximum value of a number of among a number of data n, a number n of comparison operations were required, and as the amount of data increased, an extremely large number of calculations were required, and this required a great deal of time. Accordingly, it was impossible to conduct high-speed processing by means of a microcomputer or the like, and the realization of real-time processing for the control of robots or the like was extremely difficult.

In the present invention, which employs vMOS, simply by conducting a one-time sweep of the lamp voltage of FIG. 3(b), the circuit automatically determines the maximum value, so that it is possible to conduct extremely high-speed processing. Moreover, as shown in FIG. 3(a), as the circuit can be realized using an extremely small number of elements, it can be integrated on a small chip. Furthermore, it is possible to integrate, in addition to such Winner-Take-All circuits, memory or microcomputer circuits, or D/A or A/D converters on the same chip, and if such a chip is incorporated into robots or the like it is possible to conduct extremely high level information processing at high speed, and as a result, such circuitry will have an enormous impact on automatic control technology and information processing technology. An example of the numerous applications of such circuitry is the associative memory chip; this will be discussed in the fourth embodiment of the present invention described hereinbelow.

Figure 3C:
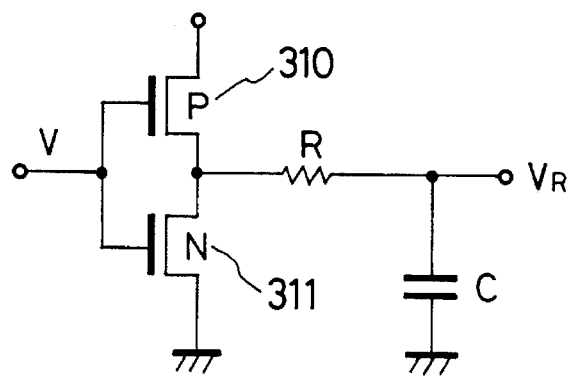

In the embodiment described above, a lamp voltage signal which increased in a straight-line manner as shown in FIG. 3(b) was employed as $V_R$; however, this is not necessarily so limited, and a signal having a voltage which increases over time may be employed. For example, if circuitry such as that shown in FIG. 3(c) is employed, an output waveform of $V_R$ such as that shown in FIG. 3(d) would be obtainable. This circuit charges condenser C through resistor R, and the start-up time thereof is approximately RC.

Figure 3D:
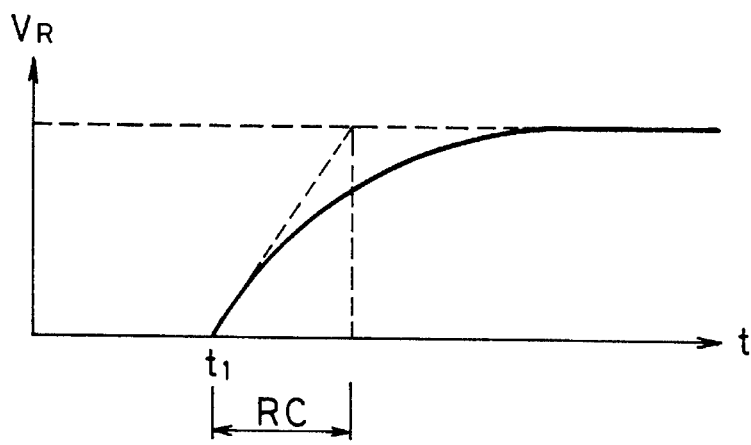

As is clear from FIG. 3(d), after time has passed through the region RC, the variation in $V_R$ becomes gentle, so that when the input voltages $V_1, V_2, \ldots, V_n$ are all small, and a magnitude comparison is conducted among values having very little difference, the use of such a $V_R$ is more precise.

Figure 3E:
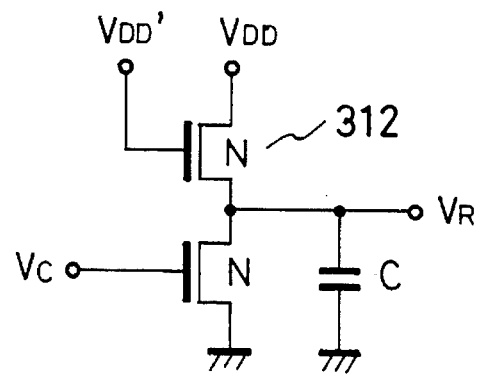

In FIG. 3(c), R and C were employed; however, for example, R may be omitted, and the ON resistance of PMS 310 may be made sufficiently larger than the ON resistance of NMOS 311. Furthermore, as shown in FIG. 3(e), the condenser C may be charged via NMOS 312. In this way, as $V_R$ approaches $V_{DD}$, the transistor 312 approaches an OFF-state, so that the resistance value thereof increases, and the proportion of the increase in $V_R$ is extremely slight, so that it is possible to conduct highly precise comparisons. If at this time $V_{DD}'-V_{TH}>V_{DD}$ is set, then the maximum value of $V_R$ becomes $V_{DD}$.

Figure 3F:
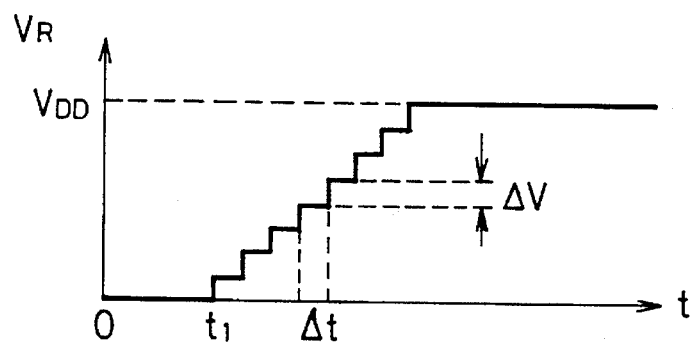
Figure 3G:
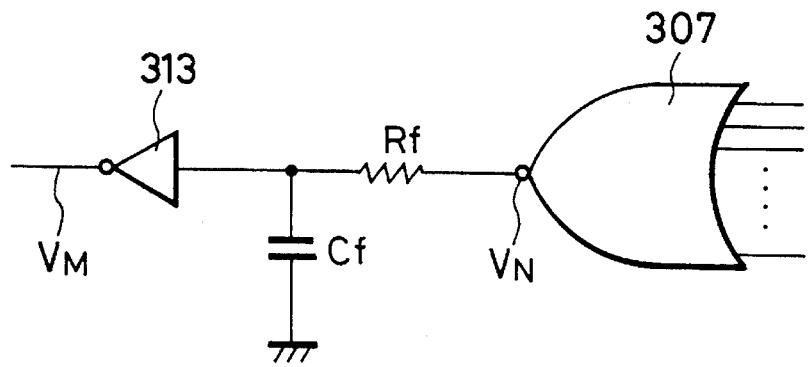

Furthermore, a stepped signal such as that shown in FIG. 3(f) may be inputted as $V_R$. If this is done, all blocks having a difference from the maximum input which is in a range of $\Delta V$ can be simultaneously set to 1. That is to say, in the case in which two or more inputs are extremely close to one another, it is possible to classify these blocks simultaneously as "winners". This has the effect of preventing mistaken operation resulting from noise and the like. By means of setting the value of $\Delta V$ to a freely selected value, it is possible to select a variety of maximum value search range parameters. A similar effect can be achieved by appending, for example, circuitry such as that shown in FIG. 3(g) to FIG. 3(a).

Reference numeral 307 indicates the NOR circuit having a number of inputs n of FIG. 3(a); if any of the inputs thereof has a value of "1", the value of the output $V_N$ falls to "0". However, since an amount of time on the level of the time constant $R_f C_f$ is required for the input voltage of the following stage inverter 313 to be reduced, the output $V_M$ thereof remains at a level of "0". That is to say, after one of the blocks outputs a value of "1", the value of $V_M$ changes from 0 to 1 after the passage of an amount of time represented by $R_f C_f$.

This value $V_M$ is inputted into the gates of the NMOS transistors 306a and 306b, and after passing through a single stage inverter, if this is inputted into the gate of the transistor 309, the feedback loop is closed, and it is possible to cut $V_R$.

In this case, when, for example, a signal such as that shown in FIG. 3(b) is used as $V_R$, the value of $R_f C_f$ should be set so as to be sufficiently smaller than T. In this way, it is possible to set the blocks having inputs within a range of approximately $V_{DD} \times (R_f C_f / T)$, with respect to the maximum value, to "1". Furthermore, any sort of waveform may be used for $V_R$. For example, a stepped waveform such as that shown in FIG. 3(f) may be combined. If at this time the value of $C_f R_f$ is set so as to be sufficiently larger than the time in which each inverter inverts, and $C_f R_f$ is set so as to be less than $\Delta T$, it is possible to accurately obtain the maximum value within the range of $\Delta V$.

Figure 4A:
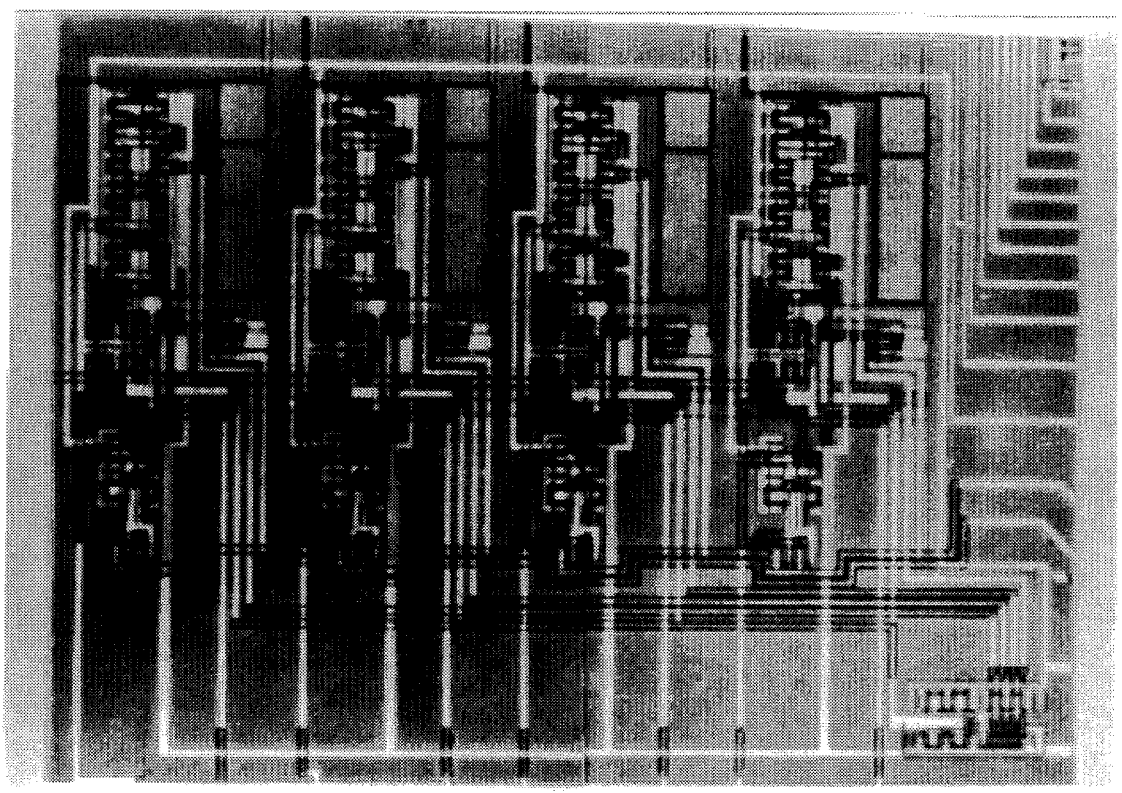
FIG. 4($a$) is a microphotograph of the integrated circuit which was experimentally produced on a silicon substrate when the winner-take-all circuit of the present invention was executed by means of CMOS and a two-layer polysilicon process.

FIG. 4(a) is a microphotograph of an integrated circuit representing the experimental execution on a silicon substrate of a Winner-Take-All circuit in accordance with the present invention by means of CMOS and a two-level polysilicon process. The contents thereof are identical to the circuitry shown in FIG. 3(a). (Here, $C_1:C_2$ is set equal to 0.4:0.6).

Figure 4B:
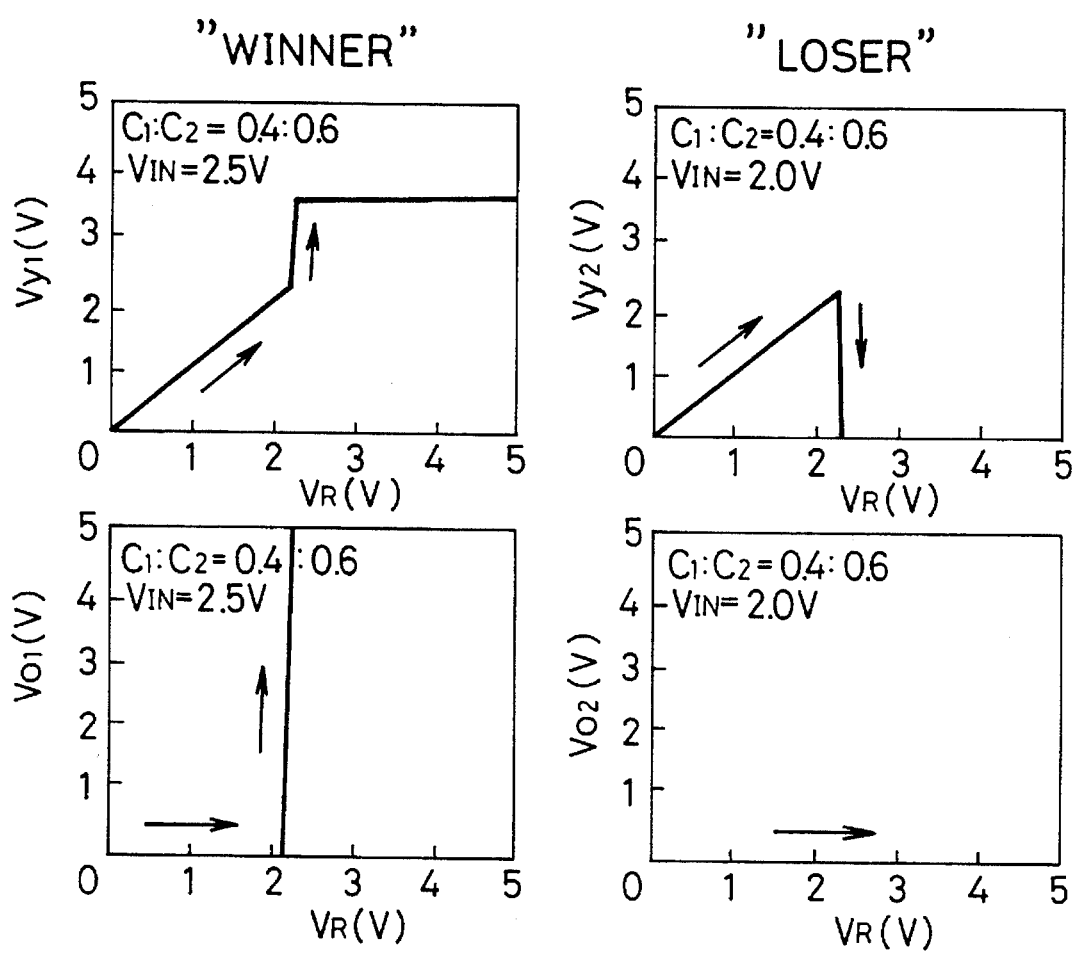

The experimental results obtained using this circuitry are shown in FIG. 4(b). The results are such that a lamp voltage such as that shown in FIG. 3(b) was applied as $V_R$; the upper two Figures show the potentials $V_{y1}$ and $V_{y2}$ of the input gate 304 of $V_R$, while the bottom two Figures indicate $V_{01}$, and $V_{02}$. It was discovered that when $V_R$ had a value of 2.2 V: the block 1 into which an input of 2.5 V was inputted was set to "1", while the block 2, into which 2.0 V was inputted, was set to "0".

In other blocks, the input was set to 2 V or less, and an experiment was conducted. The failure of the output $V_{y1}$ to exceed a maximum value of 3.5 V was due to a decline in the voltage of the threshold value component resulting from the NMOS transistor 306a, so that, for example, if a CMOS switch such as that shown in FIG. 1(b) were used, a maximum output of 5 V would be obtainable. From the foregoing, it was determined that the results which were designed for were obtained.

In the foregoing embodiment, $V_R$ was always applied to only one gate in each inverter; however, the input gate 304 may be divided into 2 or 3, and separate signals may be applied to each. That is to say, a direct current voltage can be applied to one, and the gate $V_R$ may be applied to another. By proceeding in this manner, it is possible to conduct maximum value searches within more restricted ranges.

Furthermore, for example, if gate 304 is divided into $C_1'$, $C_1''$, and $C_1'''$, and the ratio of $C_1':C_1'':C_1'''$ is set at 4:2:1, then by inputting a binary counter signal encoded in three bits in each gate, respectively, it is possible to effectively apply a stepped signal.

EMBODIMENT 3

Figure 5:
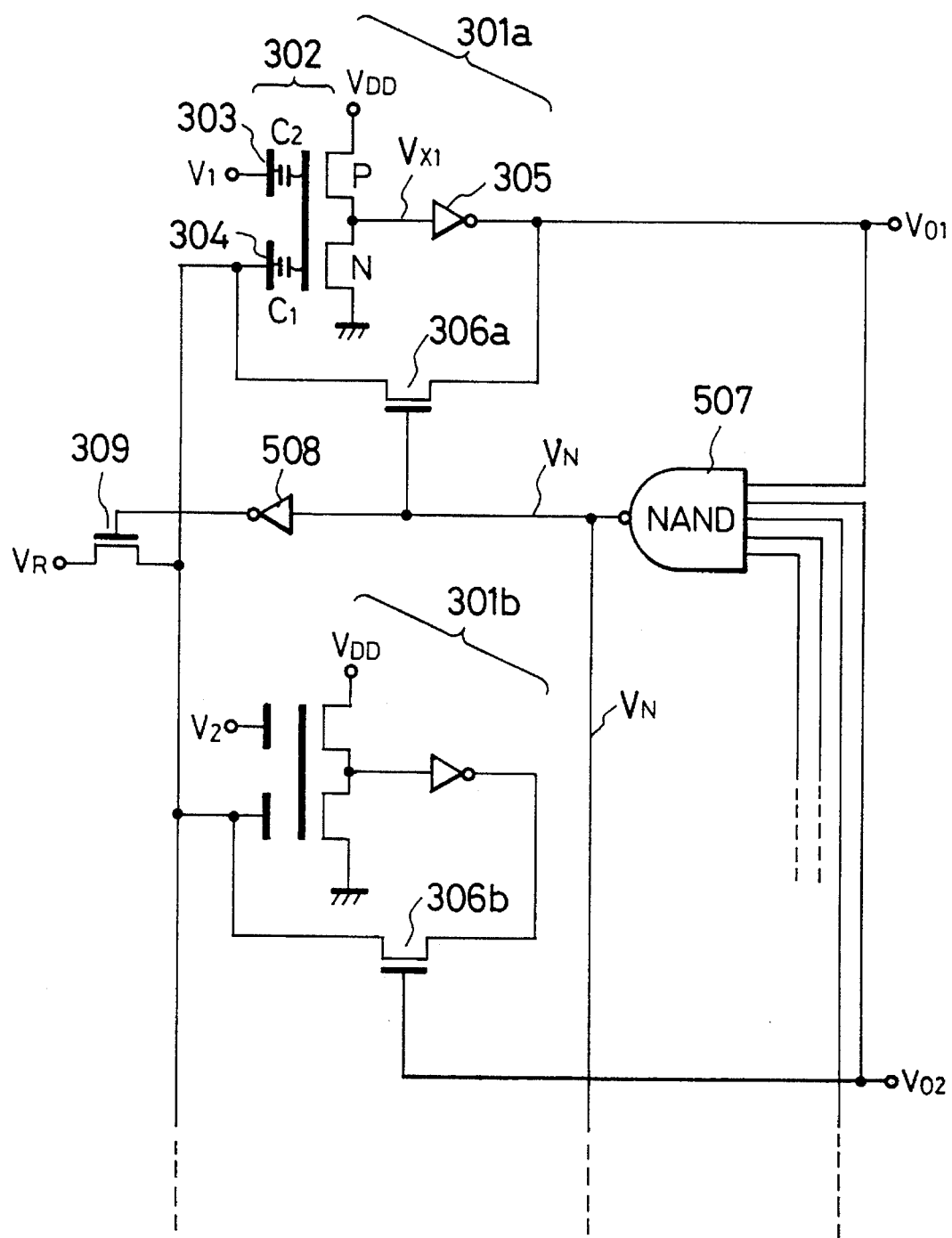
FIG. 5 is a circuit diagram showing the third example of the present invention.

FIG. 5 is a circuit diagram showing a third embodiment of the present invention. This is a circuit which finds the smallest input from among a group of inputs $V_1$, $V_2$, ..., $V_n$. The structure of the circuit is almost identical to that of FIG. 3(a), and identical parts are given identical reference numbers. The points of difference with FIG. 3(b) are that in place of the n-input NOR circuit 307, a NAND circuit 507 having a number of inputs n is used, and that the inverter 308 is not used, and in its place, an inverter 508 is inserted. In addition, a signal which decreases in a monotone manner from $V_{DD}$ towards 0 V over time is used as $V_R$.

When $V_R=V_{DD}$, Formula (6) holds true in all blocks (it is assumed that $V_i\neq 0$), and all values of $V_{0i}(i=1-n)$ are "1".

Accordingly, $V_n=0$; however, when $V_R$ begins to decrease, the inverter in the block into which the smallest input is being inputted conducts inversion, and the output falls from "1" to "0", and the value of $V_N$ changes to "1". Accordingly, the value of 0 is fixed at only that block having the smallest input, and all other blocks are fixed at a value of "1". In this manner, it is possible to determine the smallest input.

EMBODIMENT 4

Figure 6A:
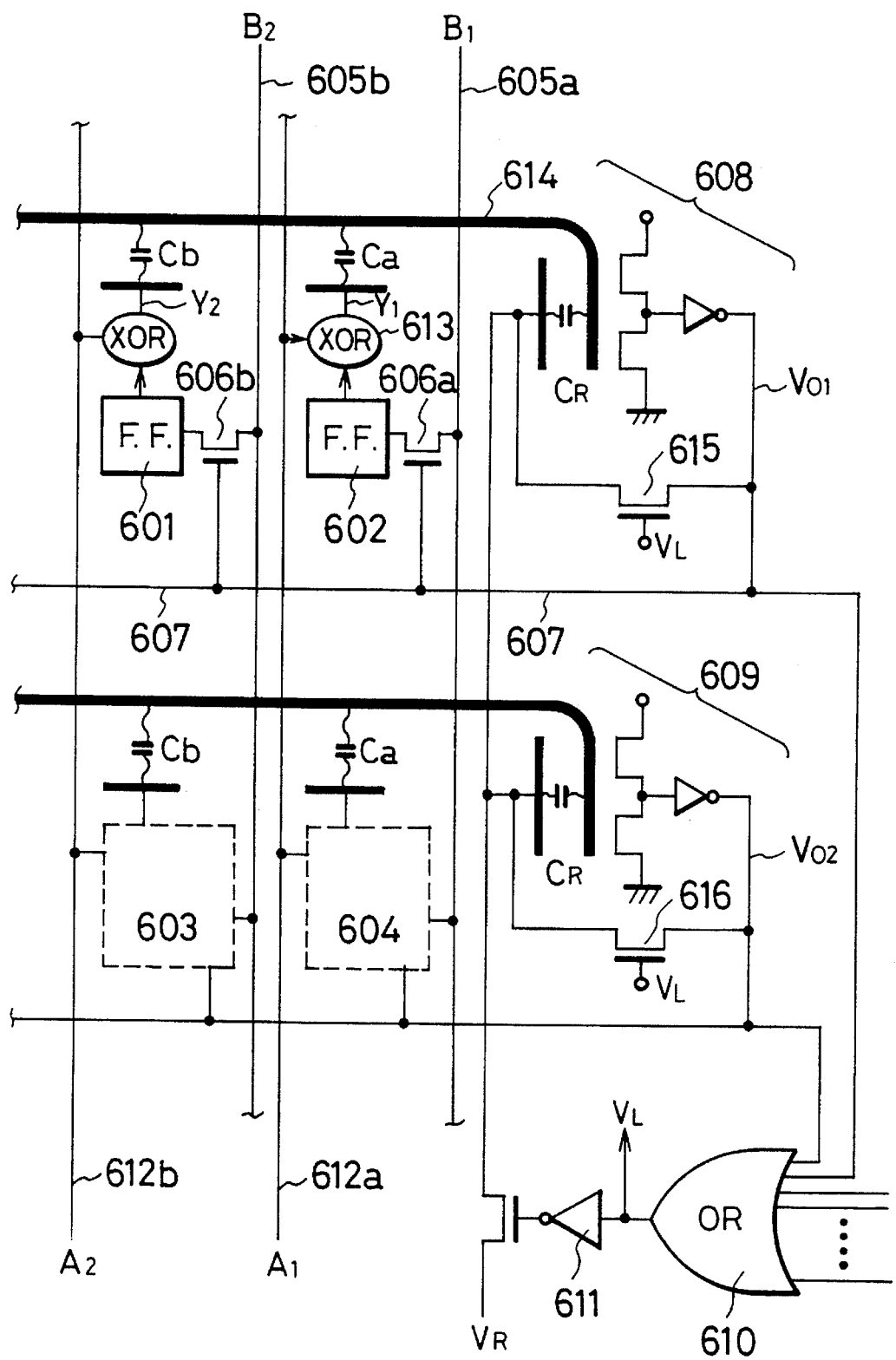
FIG. 6($a$) is a circuit diagram showing a fourth example of the present invention.

A fourth embodiment of the present invention is shown in FIG. 6(a). This embodiment shows the main portions of an associative memory circuit diagram; it is possible to realize an associative memory chip which is capable of high-speed access by means of an extremely simple structure. In the Figure, reference numerals 601–604 indicate memory elements which are capable of storing values of "1" or "0". These may employ, for example, flip-flops which are identical to the memory cells of static RAM. Dynamic RAM memory cells may also be employed, or non-volatile memory cells such as EPROM, or $E^2$PROM or the like may be employed. Here, only four cells are depicted in order to explain the fundamental principle; however, it is of course the case that more cells may be employed.

For example, cells corresponding to 8 bits may be arranged horizontally, and the necessary number of data may be arranged vertically. Furthermore, in conducting data writing into each flip-flop, the data may be set in data line 605a and 605b, and select transistors 606a and 606b and the like may be turned on and the data incorporated thereinto. The word line 607 may be set to HIGH in order to switch the selected transistors to an ON-state; however, in the Figure, the circuitry for that purpose is not depicted. This type of selected data writing is commonly-known technology, and as it has no direct relationship to the main concepts of the present invention, it is omitted here in order to facilitate the explanation.

Reference numerals 608 and 609 indicate circuits identical to those of FIG. 1(a), and these form, together with circuits such as 610, 611, and the like, a Winner-Take-All circuit such as that of FIG. 3(a).

Next, the operation of this circuitry will be explained. First, reference data $A_2$ and $A_1$ are inputted from the lines 612b and 612a, and a comparison with the data of each memory cell is conducted. For example, the comparison of $A_1$ and the data $X_1$ of memory cell 602 is carried out in the XOR circuit 613 by means of finding the exclusive OR of these data. The result $Y_1$ of this operation is transmitted to floating gate 614 via capacitor $C_a$.

That is to say, the floating gate potential $\Phi_F$ of the vMOS inverter 608 is given by the following formula.

$$\Phi_F=C_aY_1+C_bY_2+C_RV_R \quad (7)$$

This is similar in the case of the vMOS inverter 609. Accordingly, when a signal such as that in FIG. 3(a) is applied to $V_R$, the inverter having the maximum value $C_aY_1+C_bY_2$ is the first to invert.

For example, if inverter 608 has the largest value, then the value of $V_{01}$ becomes "1". Receiving this, OR circuit 610 outputs a value of 1, and $V_L$ becomes equal to "1". By means of this, the MOS transistor 615 and 616 are placed in an ON-state, the feedback loop in each inverter is closed, and the output values at this time are fixed. That is to say, the value of $V_{01}$ is fixed at "1", and the value of $V_{02}$ is fixed at 0. The potential of $V_{01}$ is transmitted to the gates of transistor 606a, 606b, and the like, via the word line 607, and these transistors enter an ON-state, so that the data $X_1$ and $X_2$ of memory cell 602 and 601 are outputted to output lines 605a and 605b. That is to say, $B_1=X_1$, and $B_2=X_2$.

These are the data which are closest to the reference data inputs $A_1$ and $A_2$. The reason for this is that the XOR circuit 613 outputs a value of "1" only when $A_1$ and $X_1$, that is to say, the reference signal and the memory contents, are in agreement, and the greater the agreement with the reference signal, the greater the value of Formula (7), and in correspondence with this, the inverter is the first to invert.

As described above, an associative memory can be constructed by means of an extremely simple circuit structure.

When attempts were made to construct an associative memory using conventional technology, it was necessary to compare all data one by one, to calculate the difference therebetween, and to determine the smallest value among these differences, so that not merely was extremely complex circuitry required, but the calculations took an enormous amount of time.

By means of the present invention, it is not merely the case that an associative memory can be integrated on an LSI chip, but high-speed operation becomes possible, and real-time control of robots and the like can be conducted in an extremely simple manner.

The size of the capacity of $C_a$, $C_b$, and the like may be set so that, for example, these capacities are equal in all cases, so that $C_a = C_b = \ldots$. If this is done, the data having the greatest number of bits in agreement between the reference input data $A_1, A_2, \ldots$ and the data $X_1, X_2, \ldots$ within the memory cells will be read out, so that the data having the smallest Hamming distance are read out from among the data.

Alternatively, if the size of $C_a$, $C_b$, and the like is set so as to be in such a ratio so as to represent powers of 2, that is to say, $C_a:C_b:C_c\ldots = 1:2:4\ldots$, then the circuit determines the number having the smallest difference with respect to the individual members represented in binary format. Alternatively, the ratio may be set to a freely determined size, and weighting may be applied to the data of the bits in accordance with the degree of importance thereof.

In the foregoing, in order to simplify matters, only that case was explained in which only one datum possesses a smallest difference from the reference data; however, it is possible to easily read out the data in a similar manner even when two or more such data are present.

In such a case, what is required is not the circuit of FIG. 6(a), but rather a control circuit, in which, after a value of "1" was fixed, for example, in the inverter having the closest data, only the data in the memory cells in the same row as that in which the value of "1" was fixed are read out in order. To this should be added a circuit to which, in the case in which simultaneous inversion occurs, provides excess memory cells for writing a value of "1" into the various blocks, and when the signal thereof has a value of "1", conducts sequential readout. Such control can be accomplished in a simple manner using conventional technology.

In the circuit of FIG. 6(a), a large amount of transistors is normally necessary to construct an XOR circuit; however, if vMOS are employed, it is possible to realize such a circuit using only 4 transistors (Japanese Patent Application, Hei 3-83152). Conventional transistors may be employed; however, by means of the application of vMOS transistors, it is possible to simplify the overall structure.

In the circuit of 6(a), values $Y_1$ and $Y_2$, representing the XOR of the reference data $A_1$ and $A_2$ and the data $X_1$ and $X_2$ stored in the memory cells 602 and 601, are inputted into the input gates of vMOS inverter 608 and the like; however, this XOR circuit 613 may be replaced with, for example, an XNOR (the negative of exclusive OR) circuit. At this time, the data having the least amount of agreement with the reference data will be selected. That is to say, the data having the greatest amount of difference can be read out.

As described above, various functions can be realized in a simple manner. In the case in which a size ratio is established for $C_a$, $C_b$, $C_c$, ..., so that these have the values of powers of 2, that is to say, $1:2:4:8\ldots$, as the number of bits in the input data increase, the precision of the magnitude comparison is reduced. In particular, the magnitude comparison of two data in which only the least significant bit differs becomes difficult. In order to solve this problem, for example, the fifth embodiment of the present invention, which is depicted in FIG. 6(b), may be employed.

EMBODIMENT 5

Figure 6B:
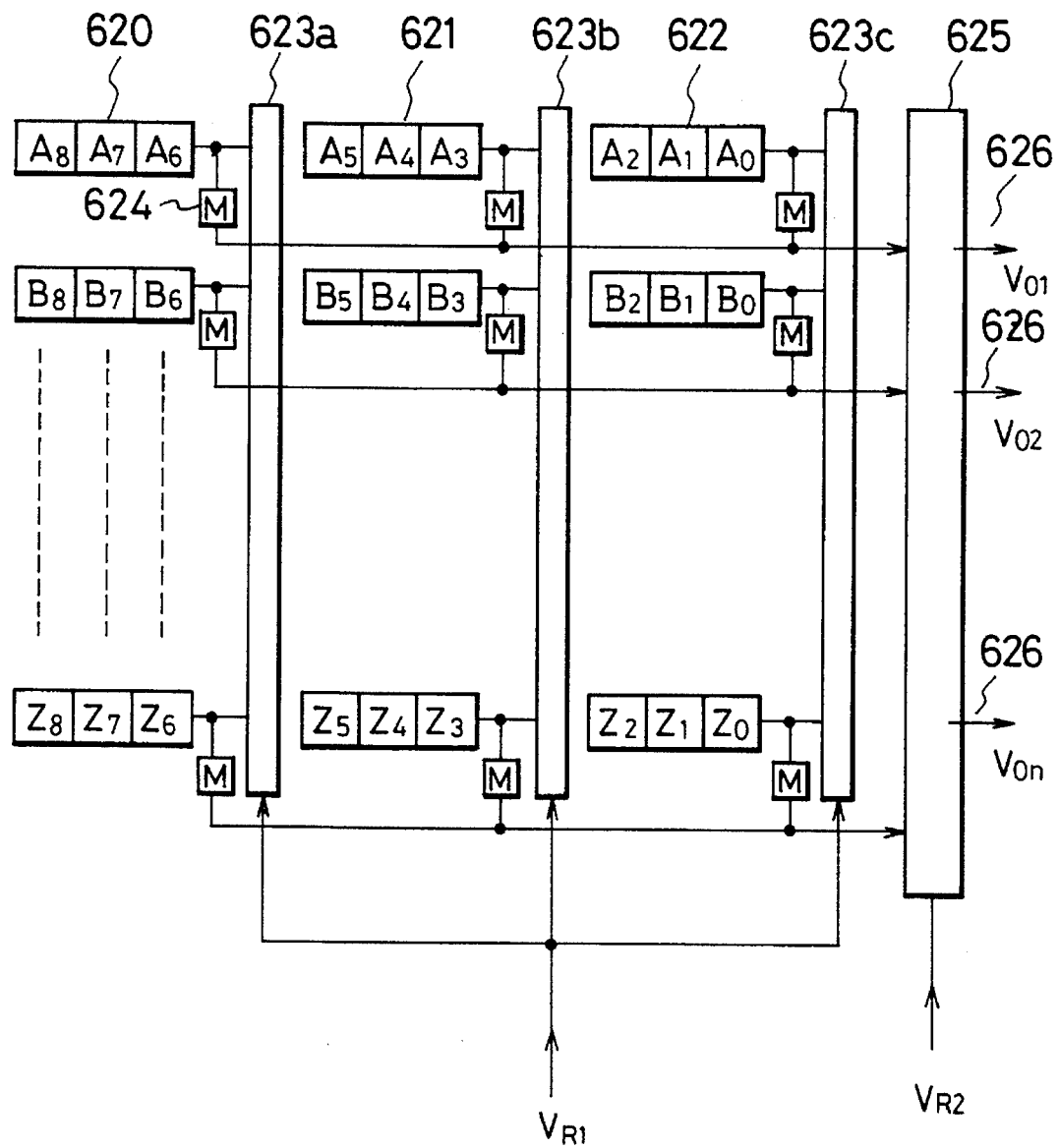

FIG. 6(b) shows, in schematic form, the circuit structure in the case in which association is conducted using a memory which stores, for example, a number of 9-bit data n. Starting from the top, the following data are stored: $(A_8, A_7, A_6, \ldots, A_0)$, $(B_8, B_7, B_6, \ldots, B_0)$, $(C_8, C_7, C_6, \ldots, C_0)$, ... $(Z_8, Z_7, Z_6, \ldots, Z_0)$.

Reference numerals 620, 621, and 622 respectively, store the data in 3-bit units from the largest places. Reference numeral 623a indicates a Winner-Take-All circuit which determines the largest value among a number of data n from A~Z using only the more significant 3-bit unit data; a value of "1" is fixed in only that cell having the maximum value of signal $V_{R1}$. Reference numeral 624 indicates a 1-bit memory cell which functions by sweeping from 0 to 5 V for this purpose; in actuality, this fixes a value of "1" by applying feedback to the vMOS inverter as in FIG. 6(a).

If a similar magnitude comparison is conducted with respect to other less significant bit data simultaneously by sweeping $V_{R1}$ from 0 to 5 V, then in accordance with the various magnitudes, values of "1" or "0" are stored at the various positions. Reference numeral 625 indicates a Winner-Take-All circuit which conducts a comparison of the 3-bit data which are stored; by means of sweeping $V_{R2}$, a value of "1" is fixed in the output line 626 corresponding to the largest data. By means of this, the largest data among a number of 9-bit data n can be detected and outputted. If this output line is, for example, returned to the word line 607 of FIG. 6(a), then it is possible to weed out the data which are closest to the reference data.

In this embodiment, 3 bits are employed as one group; however, insofar as accuracy can be maintained, this may be increased. Furthermore, Winner-Take-All circuits driven by the two signals $V_{R1}$ and $V_{R2}$ were employed in two stages; however, it is of course the case that this may be increased. By employing a number of bits m as a group of data, and by combining a number of stages r of Winner-Take-All circuits, it is possible to conduct the accurate data comparison of a number of bits $m^r$.

Figure 7:
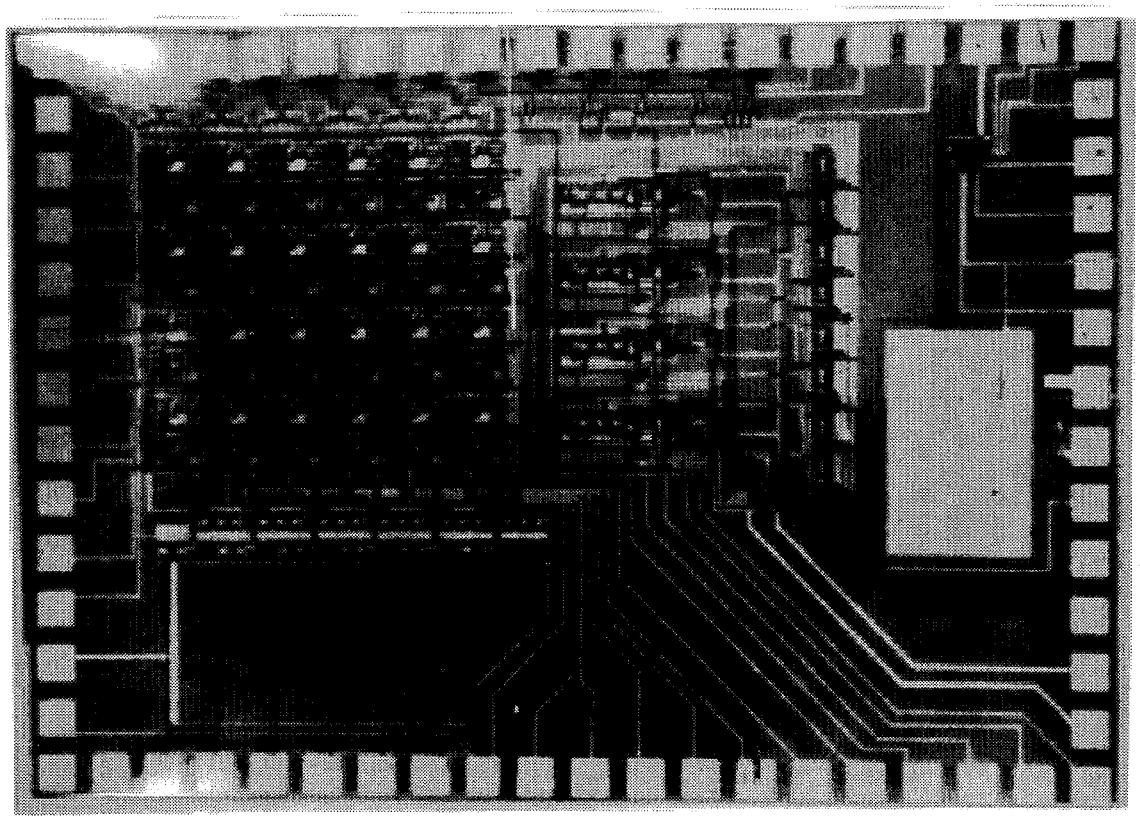
FIG. 7 shows an example in which the circuit of FIG. 6($a$) was realized on a silicon chip by means of a two-level polysilicon CMOS process.

FIG. 7 shows an example in which the circuitry of FIG. 6(a) was realized on a silicon chip by means of a 2-level polysilicon CMOS process. In this test circuit, 6 flip-flops were arranged in a row, and 4 stages thereof were provided; it was confirmed that the operation thereof was in accordance with the design.

EMBODIMENT 6

Figure 8:
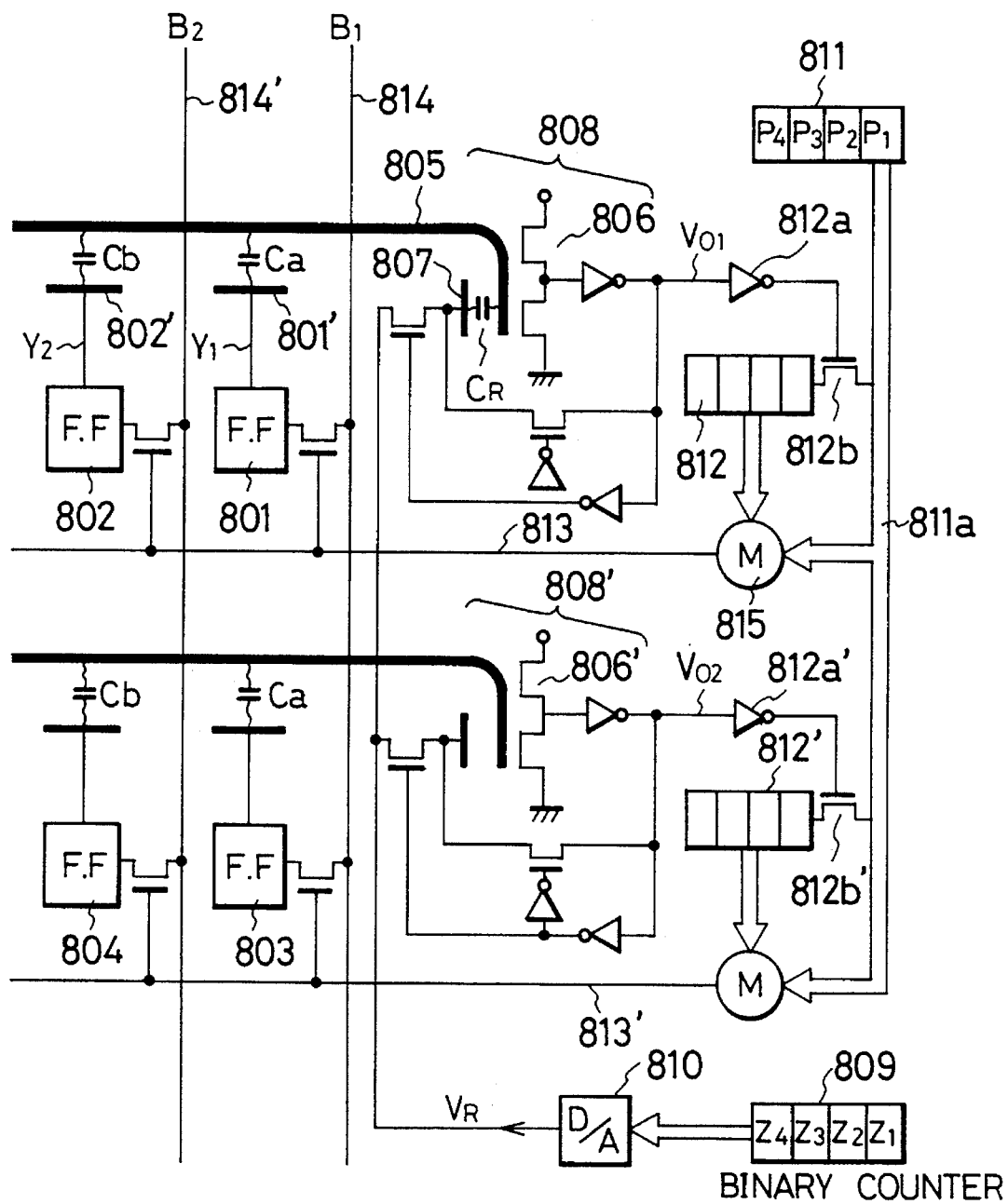
FIG. 8 is a circuit diagram showing a sixth example of the present invention.

FIG. 8 is a circuit diagram showing a sixth embodiment of the present invention; this is a sorting circuit which arranges data according to size.

For example, one datum expressed in binary format is stored in one row of flip-flops (here, for the purposes of explanation, only 2 are shown) 801 and 802, and a separate datum is stored in the lower row of flip-flops 803 and 804.

The data $Y_1$ and $Y_2$ of 801 and 802 are transmitted to the floating gate 805 of the vMOS inverter 806 by means of capacitive coupling from the input gates 801' and 802', respectively.

A signal $V_R$ is inputted from another input gate 807 into the floating gate 805 of the vMOS inverter 806. The potential $\Phi_F$ of this floating gate is identical to that in Formula (7).

Circuit 808 is identical to the first embodiment of the present invention ((C) in FIG. 1); when $\Phi_F$ exceeds the threshold value of the inverter, the inverter inverts, and at this time, the output $V_{01}$ is fixed at a value of "1".

Next, the operation of this circuit will be explained.

Reference numeral 809 indicates a 4-bit binary counter; this circuit counts up from $(Z_4, Z_3, Z_2, Z_1)=(0, 0, 0, 0)$ to $(1, 1, 1, 1)$, that is to say, from 0 to 15.

The output thereof is first converted to an analog signal by D/A converter 810, and this is used as $V_R$. By proceeding in this manner, the signal waveform of $V_R$ has a stepped form such as that shown, for example, in FIG. 3(f).

It will be assumed that the design is such that $C_b=2C_a$, and $C_R=C_a+C_b$. Furthermore, if the inversion voltage of inverters 806 and 806' is set to $V_{DD}/2$ (=2.5 V), then the conditions under which inverters 806 and 806' will invert are:

$$\{(1/3)\cdot(5/2)\cdot(2Y_2+Y_1)\}+\{(1/15)\cdot(5/2)\cdot(8Z_4+4Z_3+2Z_2+Z_1)\}\geq 5 \quad (8)$$

Here, $Y_1$, $Y_2$, and $Z_1 \ldots Z_4$ are binary signals having a value of "0" or "1".

The first item enclosed within the braces at the left hand side of Formula (8) corresponds to the size of the data stored in each memory row, while the second item corresponds to the counter output. Accordingly, when the counter conducts a count-up, the inverter of the row in which the largest data are stored is the first to invert, so that, for example, the value of $V_{01}$ is fixed at "1". On the other hand, reference 811 indicates a binary counter circuit. Initially, it is reset to, for example, $(P_4, P_3, P_2, P_1)=(0, 0, 0, 1)$. These values are inputted into 4-bit memory cells (812, 812') which are disposed, respectively, in each block, by means of four data lines 811a (these are indicated in the Figure by a single arrow in order to simplify the depiction) via pass transistors 812b and 812b'. When the value of the $V_{01}$, $V_{02}$ ... of each series is "0", the output thereof is inverted by inverters 812a and 812a', and is inputted into the gate electrodes of transistors 812b and 812b', so that these transistors are placed in an ON-state; however, if the value of, for example, $V_{01}$ is initially fixed at "1", the pass transistor 812b is placed in an OFF-state, and a counter output of 001 is stored in the 4-bit memory 812. After this, the value of $V_{01}$ continues to be fixed at "1", so that the transistor 812b is constantly in an OFF-state, and the 3 data within the memory do not change. That is to say, the 3 block data in memory 812 have the largest value, that is to say, it is recorded that they are in first place (001).

When transistor 812b is placed in an OFF-state, and the data of counter 811 have been incorporated, the counter counts up by one place, and $(P_4, P_3, P_2, P_1)=(0, 0, 1, 0)$, that is to say, this is set equal to 2.

The counting up of counter 809 proceeds further and as $V_R$ increases, the inverters invert in sequence by size, and the outputs thereof sequentially change from "0" to "1". Simultaneously with this, the positional ranks are stored in the 4-bit memory cells belonging to each row. That is to say, when the binary counter 809 finishes counting up from "0" to "15", a positional ranking number has been applied to all data. If setting is conducted so that thereinafter, counter 811 is reset and again counts up from "1" to "15", and a comparison is conducted with the data of the memories (812, 812') of the positional ranking numbers belonging to each row, and word lines 813 and 813' are set to "1" when complete agreement is determined, then the data of each memory will be read out into data lines 814 and 814' according to size. Here, circuit M 815 is a matching circuit; this logical circuit outputs a value of "1" only when the contents of the binary counter 811 and the memory 812 are in agreement.

Here, a detailed explanation was given with respect to binary counters 809 and 811 and the matching circuit 815, as well as the control methods of these circuits; however, it is of course the case that these may all be realized by means of conventional technology.

if, as described above, vMOS Winner-Take-All circuitry is employed, data sorting which conventionally required an enormous amount of time can be executed in an extremely simple and high-speed manner, and this will have an enormous impact in applications in the analysis of automatic control.

EMBODIMENT 7

Figure 9:
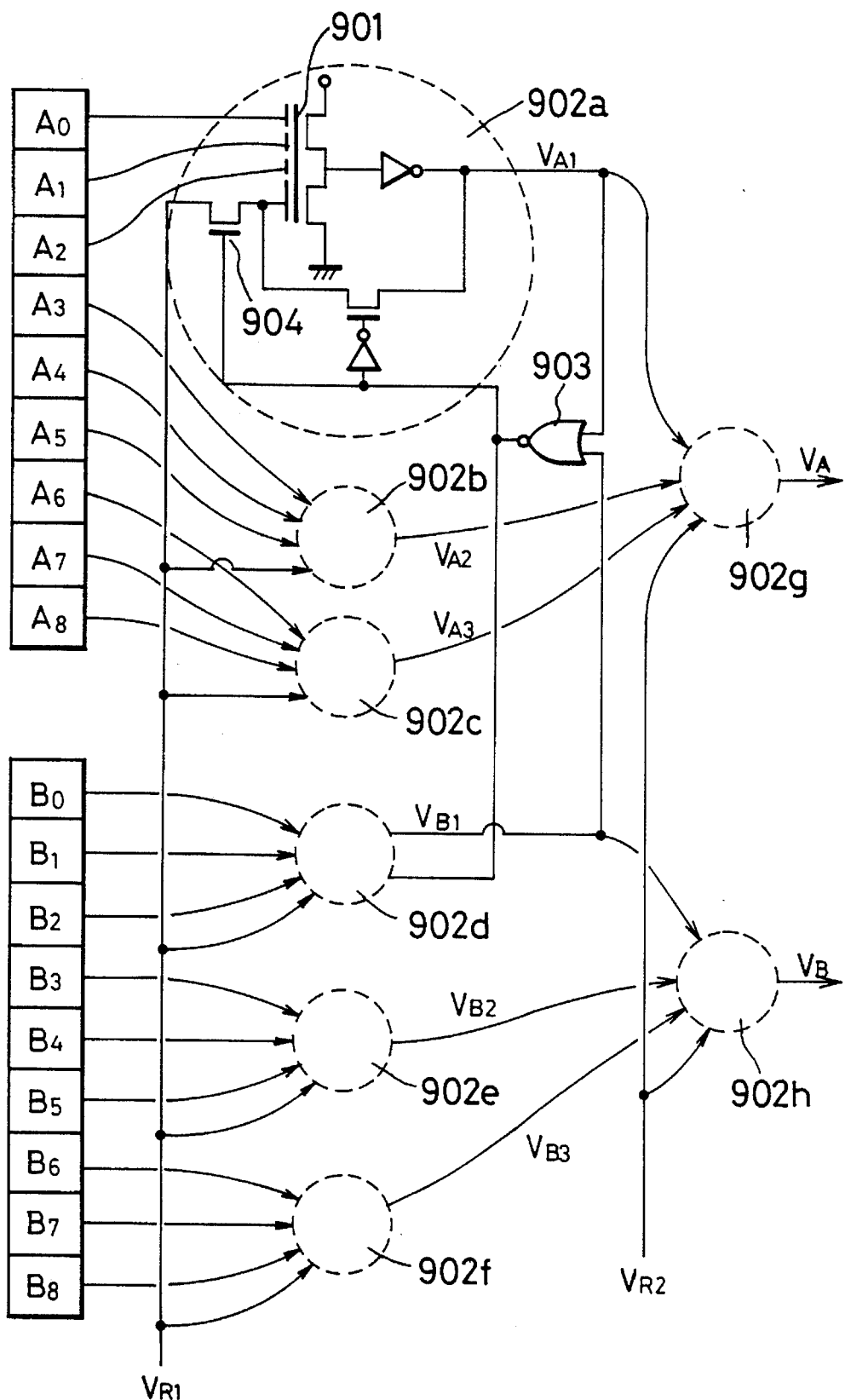
FIG. 9 is a circuit diagram showing a seventh example of the present invention.

FIG. 9 shows a circuit diagram of a circuit which instantly determines the magnitude of 9-bit binary numbers, which comprises a seventh embodiment of the present invention.

References $A_0, A_1, \ldots, A_8$, and $B_0, B_1, \ldots, B_8$, indicate 9-bit binary numbers, respectively, and $A_0$ and $B_0$ are the least significant bits.

If, in a vMOS inverter such as that shown in FIG. 1(c), the number of input gates 106''', 106'', and 106' is increased, and such 9-bit data are directly inputted thereinto, as is normally the case, the noise margin becomes small, and this causes a problem. An example of a solution to this problem is the present embodiment.

Reference numeral 901 indicates an inverter identical to the inverter 103 of FIG. 1(c); a feedback loop is provided, and block 902a forms, in a pair with block 902d, a Winner-Take-All circuit such as that shown in FIG. 3(a). Blocks 902a~902h all comprise the same circuitry, so that the details thereof are omitted in the Figure. The points of difference from FIG. 3(a) are that with respect to the n-input NOR circuit 307, a 2-input NOR 903 is employed, and a transistor 904 for cutting $V_{R1}$ is provided within each block.

Furthermore, 902b and 902e, 902c and 902f, and 902g and 902h, form, in pairs, identical Winner-Take-All circuits; however, the wiring for this purpose is identical to that of the pair of 902a and 902d, so that in order to simplify the diagram, this wiring is omitted.

First, by increasing the signal $V_{R1}$, the output of the larger within each pair becomes "1", and the output of the smaller becomes "0". That is to say, a magnitude comparison is conducted per 3 bits from the least significant, and in accordance with the various magnitudes, $V_{A1}, V_{A2}, V_{A3}$, and $V_{B1}, V_{B2}, V_{B3}$, are assigned values of "0" or "1", respectively. If these outputs are again subjected to a magnitude comparison in the pair of blocks 902g and 902h, the final result is outputted to $V_A$ and $V_B$ as an output signal. $V_{R2}$ is a control signal which is identical to $V_{R1}$ for this purpose. If, for example, $B_0 \ldots B_8$ is larger than $A_0 \ldots A_8$, then $V_B=1$ and $V_A=0$. In this manner, the comparison of 9-bit binary numbers can be executed at an extremely high speed by arranging Winner-Take-All circuits in two stages.

Here, the inputs into each vMOS inverter 901 were set at 3 bits; however, it is of course the case that this may be increased. For example, if 4 bits are inputted, a comparison of $4^2$ or 16 bits would be possible with the two-stage structure of this example. If three stages were employed, it would be possible to conduct the comparison of 64-bit data.

As described above, it is possible to execute, in a simple manner, the comparison of numerical magnitudes, which is extremely important in the automatic control of robots or the like.

When two data are in complete agreement, there are cases in which as a result of the influence of noise, one or the other is determined to be larger; however, the cases of complete agreement may be detected by means of conventional technology, and it is of course the case that such technology may be added.

In the foregoing, in all embodiments, the vMOS inverter had a CMOS structure; however, it is of course the case that these may comprise NMOS, E/E, or E/D inverters.

Furthermore, only that case was explained in which the floating gates of all the vMOS inverters were operated so as to constantly be in a floating state; however, switching transistors may be connected to the floating gates, and the potential of the floating gate may be appropriately set to predetermined values by means of the ON- or OFF-state of these transistors.

By means of this, the threshold value of the vMOS inverters may be changed, or the charge injected into the floating gate during operation may be refreshed.

INDUSTRIAL APPLICABILITY

By means of the present invention, it is possible to conduct the comparison of the magnitude of a plurality of data at an extremely high speed.

Moreover, as the circuitry can be realized by means of an extremely small number of elements, large-scale integration is a simple matter. Accordingly, a wide range of applications are possible, such as in the field of the automatic control required by high-speed and real-time processing.

What is claimed is:

1. A semiconductor device comprising one or more neuron MOS transistors possessing a semiconductor region of one conductivity on a substrate, having a source and a drain of opposite conductivity provided within this region, having a floating gate electrode which is provided via an insulating film on a region separating said source and drain regions and which is in a potentially floating state, and possesses a plurality of input gate electrodes which are capacitively coupled via an insulating film with said floating gate electrode, characterized in being provided with:

an inverter circuit group containing one or more inverter circuits formed by neuron MOS transistors;

a means for applying to a first input gate of said inverter circuit a first signal voltage which is common to one or more inverters belonging to said group of inverters;

a means for applying a predetermined second signal voltage to one or more second input gates other than said first input gate of said inverter circuit; and a means for detecting the variation in the output voltage produced in at least one input inverter circuit of said inverter circuit group as a result of the variation over time of either said first or said second signal voltage or both signal voltages, and for applying positive feedback to predetermined inverters of said inverter circuit group by means thereof.

2. A semiconductor device in accordance with claim 1, characterized in being provided with two or more of said second input gates, and into which gates a binary signal of "0" or "1" is inputted.

3. A semiconductor device in accordance with claim 2, characterized in that memory cells disposed in a matrix pattern which store binary signals having a value of "1" or "0" are provided, and results of predetermined logical operations conducted with respect to outputs of predetermined memory cells belonging to columns or rows are inputted into said second input gates.

4. A semiconductor device in accordance with claim 3, characterized in that said predetermined logical operations comprise the calculation of the exclusive OR value with externally inputted data.

5. A semiconductor device in accordance with claim 3, characterized in that said predetermined logical operations comprise the calculation of the negative exclusive OR value with externally inputted data.

6. A semiconductor device in accordance with claim 3, characterized in that switching transistors for reading out to the exterior data within memory cells are provided at said memory cells, and said transistors enter an ON-state only when output data of inverters having said second input gates reach a predetermined value, and data within said memory cells is read out to the exterior.

7. A semiconductor device in accordance with claim 4, characterized in that switching transistors for reading out to the exterior data within memory cells are provided at said memory cells, and said transistors enter an ON-state only when output data of inverters having said second input gates reach a predetermined value, and data within said memory cells is read out to the exterior.

8. A semiconductor device in accordance with claim 5, characterized in that switching transistors for reading out to the exterior data within memory cells are provided at said memory cells, and said transistors enter an ON-state only when output data of inverters having said second input gates reach a predetermined value, and data within said memory cells is read out to the exterior.

* * * * *

UNITED STATES PATENT AND TRADEMARK OFFICE
CERTIFICATE OF CORRECTION

PATENT NO.    :   5,521,858
DATED         :   May, 28, 1996
INVENTOR(S)   :   Tadashi Shibata It is certified that error appears in the above-indentified patent and that said Letters Patent is hereby corrected as shown below:

Title page, items

[22]    PCT Filed:  July 29, 1993

[86]    PCT No.:  PCT/JP93/01071

Section 371 Date:  January 29, 1995

Section 102(e) Date:  February 28, 1995

[87]    PCT Pub No.:  WO 94/03929

PCT Pub Date:  February 17, 1994

Signed and Sealed this

Twenty-seventh Day of August, 1996

Attest:

BRUCE LEHMAN

Attesting Officer      Commissioner of Patents and Trademarks